US012699427B2

(12) United States Patent
Chigullapalli et al.

(10) Patent No.: US 12,699,427 B2
(45) Date of Patent: Aug. 4, 2026

(54) FLUID CLEANING APPARATUS FOR A COMPUTING SYSTEM

(71) Applicant: AMD Design, LLC, Wilmington, DE (US)

(72) Inventors: Sruti Chigullapalli, Seattle, WA (US); Chen An, Bergenfield, NJ (US); Pruthvik Raghupathi, Passaic, NJ (US); Peter Cloney, Woodinville, WA (US)

(73) Assignee: AMD Design, LLC, Wilmington, DE (US)

( * ) Notice: Subject to any disclaimer, the term of this patent is extended or adjusted under 35 U.S.C. 154(b) by 322 days.

(21) Appl. No.: 18/476,633

(22) Filed: Sep. 28, 2023

(65) Prior Publication Data

US 2025/0110534 A1 Apr. 3, 2025

(51) Int. Cl.
G06F 1/20 (2006.01)
H05K 7/20 (2006.01)

(52) U.S. Cl.
CPC ........... G06F 1/20 (2013.01); H05K 7/20272 (2013.01)

(58) Field of Classification Search
CPC ........ F24F 8/142; H05K 7/20272; C02F 1/30; C02F 1/32; C02F 1/325; C02F 2201/3225; B08B 7/0057

USPC .......................................... 165/95; 210/748.1
See application file for complete search history.

(56) References Cited

U.S. PATENT DOCUMENTS

| | | | | |
|---|---|---|---|---|
| 7,267,477 | B1 * | 9/2007 | Plache | B01F 23/54 366/165.2 |
| 2012/0151957 | A1 * | 6/2012 | Kamiyama | F25B 43/006 62/430 |
| 2022/0117119 | A1 * | 4/2022 | Heydari | A61L 2/10 |
| 2023/0226234 | A1 * | 7/2023 | Albino | C02F 1/722 422/24 |

FOREIGN PATENT DOCUMENTS

JP        H07289407 A   *   11/1995

* cited by examiner

*Primary Examiner* — Steve S Tanenbaum
(74) *Attorney, Agent, or Firm* — SCULLY, SCOTT, MURPHY & PRESSER, P.C.

(57) ABSTRACT

A fluid cleaning apparatus is provided for a computing system. The fluid cleaning apparatus includes a body forming a reservoir in fluid communication with a liquid cooling system. The reservoir is operable to receive fluid from the liquid cooling system. A cleaning unit is operable to reduce bacterial growth in the fluid received in the reservoir. A return component is in fluid communication with the reservoir and the liquid cooling system such that the fluid in the reservoir flows back into the liquid cooling system.

18 Claims, 5 Drawing Sheets

FLUID CLEANING APPARATUS FOR A COMPUTING SYSTEM

FIELD

The present disclosure relates generally to a fluid cleaning apparatus operable to reduce bacterial growth in liquid cooled computing systems.

BACKGROUND

Computing systems are continually improving and becoming more powerful. The chips, for example artificial intelligence chips, are becoming more powerful, which leads to increased thermal design power. Liquid cooling is utilized to manage the heat generated by the chips.

BRIEF DESCRIPTION OF THE DRAWINGS

Implementations of the present technology will now be described, by way of example only, with reference to the attached figures, wherein.

DETAILED DESCRIPTION

Figure 1:
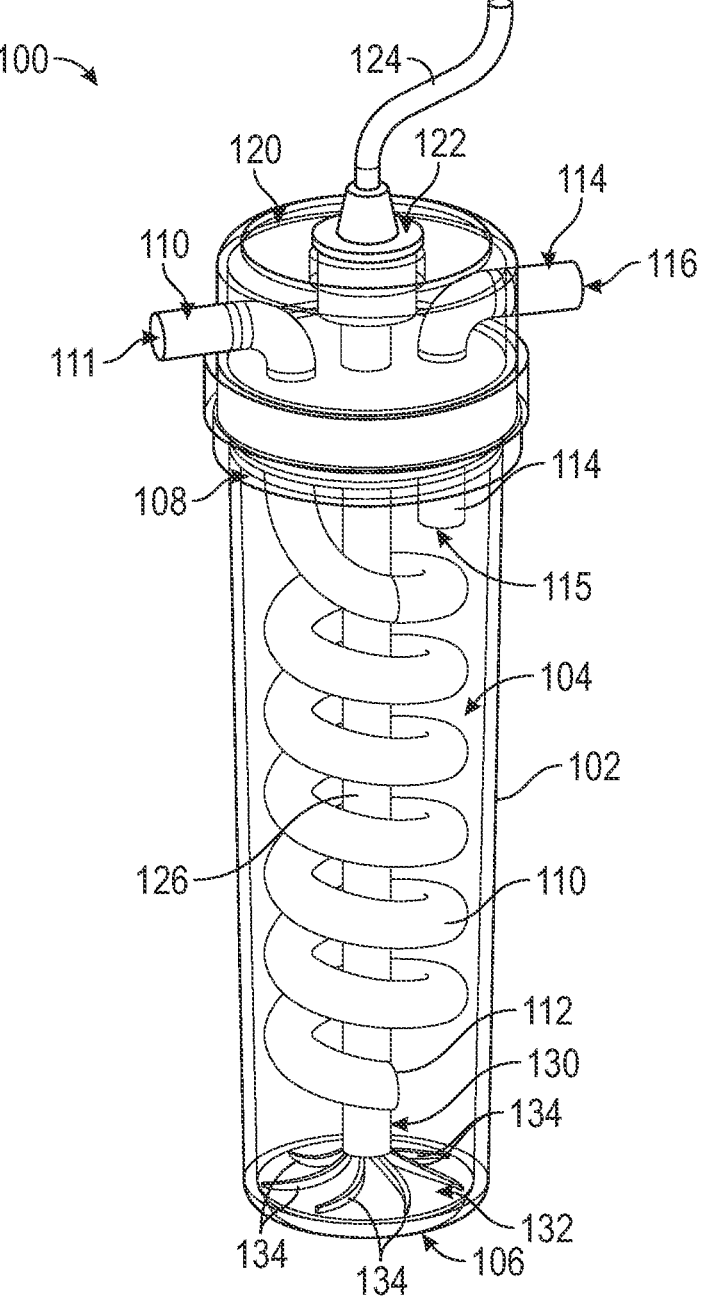
FIG. 1 illustrates a fluid cleaning apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Liquid cooling for computing systems can include a closed loop of fluid. In some examples, the fluid can include PG25 which can include 25% of propylene glycol and 75% water. PG25 can act as a bio growth inhibitor but can come with a 20% penalty in cooling compared to pure water.

The fluid cycling through the liquid cooling system is warm. Accordingly, fluid quality management becomes extremely important as bio growth (for example bacteria growth) excels in warm water. Bio growth can then deposit in micro-channels and/or fins in the liquid cooling system. The bio growth deposit causes performance issues and impacts operational efficiency, energy consumption, and costly cleaning procedures.

In some examples, biofilms can become excellent environments to foster the growth of *Legionella*. One single bacteria or spore is enough to create significant sized bacterial colony units in a span of less than one week.

Conventional solutions include combinations of filter and algaecide/biocide to mechanically catch the bacteria and then chemically kill the bio growth respectively. Both the filter and the algaecide/biocide use constant onsite inspection and/or maintenance. Additionally, too much biocide causes problems, and too many filters in the liquid cooling loop can cause problems. Further, conventional solutions require biochemists, metallurgy engineers, anti-corrosion, pH balancers, and other additional costs and potential sources of problems. Also, biofilms need DNA sequencing to know what type of chemicals or balance of chemicals are needed to reduce the bio growth.

The disclosure now turns to FIG. 1, which illustrates an example of a fluid cleaning apparatus 100 to be used with a computing system 10 that utilizes a liquid cooling system 50, for example, a liquid cooled personal computing device, a liquid cooled modular server, and/or a liquid cooled information handling system.

The fluid cleaning apparatus 100 can be utilized to reduce bacterial growth in the fluid for the liquid cooling system. For example, the fluid cleaning apparatus 100 can be operable to continuously kill bacteria in the fluid that flows through the fluid cleaning apparatus 100. The fluid cleaning apparatus 100 can be connected into the liquid cooling system such that the fluid cleaning apparatus 100 receives a continuous flow of the fluid from the liquid cooling system, kills or reduces the bacteria in the fluid, and returns the cleaned fluid to the liquid cooling system. The fluid cleaning apparatus 100 can be in-situ and fully automated such that human intervention would not be needed until a service event.

Figure 2A:
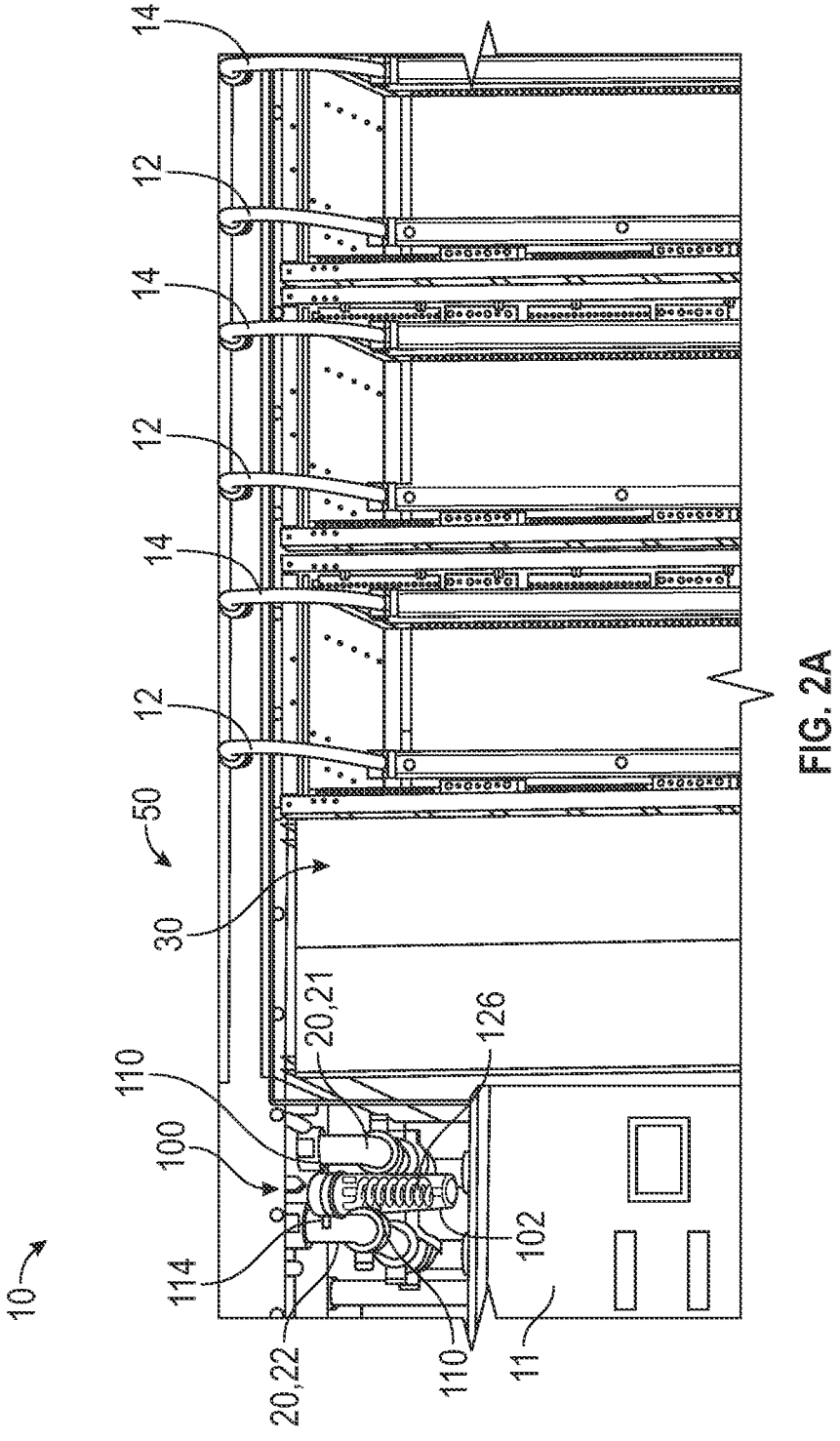
FIG. 2A illustrates a computing system with the fluid cleaning apparatus in fluid communication with a liquid cooling system.
Figure 2B:
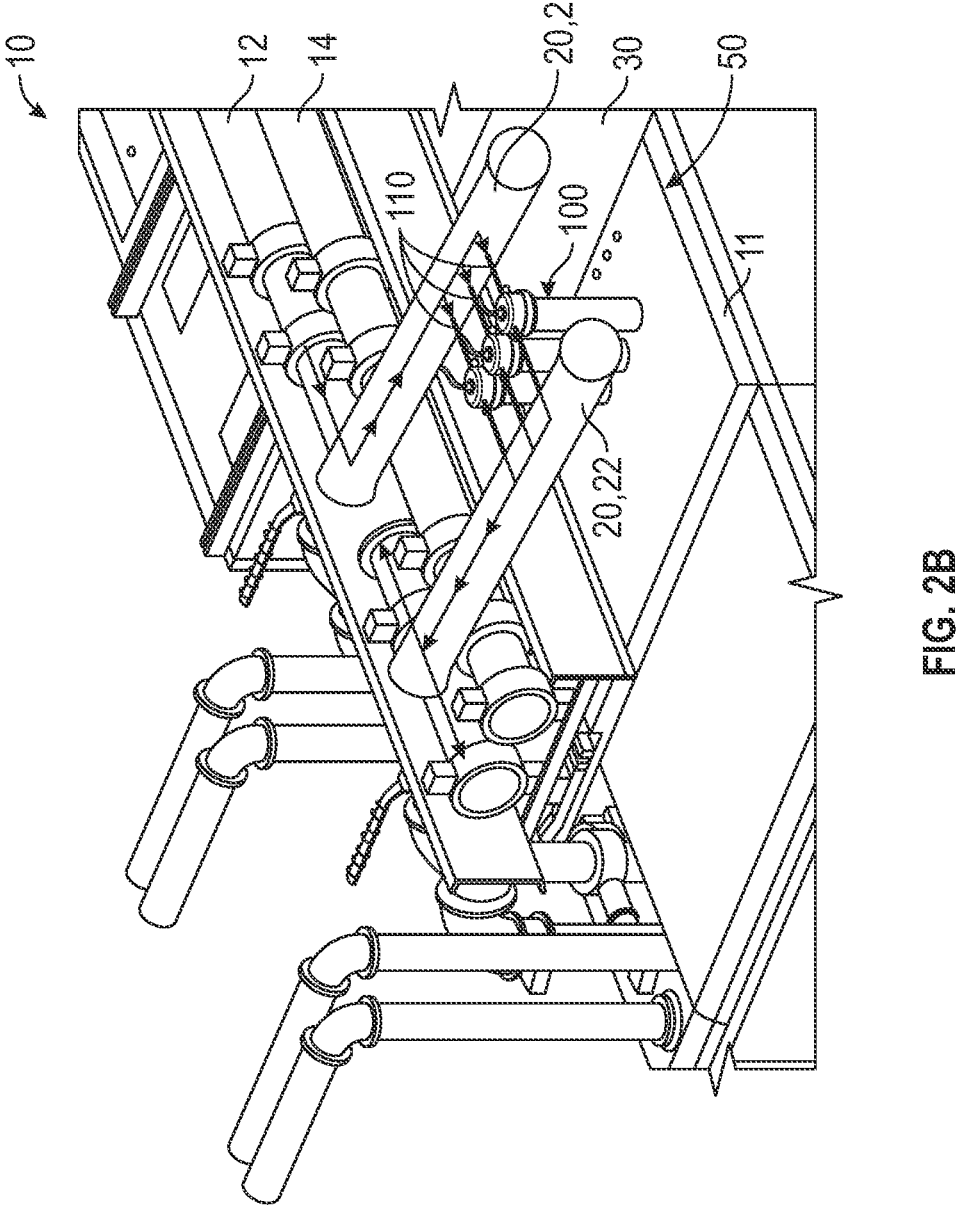
FIG. 2B illustrates a top perspective view of the computing system of FIG. 2A.

FIGS. 2A and 2B illustrate a computing system 10 that includes a liquid cooling system 50 operable to circulate the fluid to manage a temperature of one or more computing components 30. Thermal management of computing systems 10 can be critical to the performance and time between failures for the computing system 10. As computing systems 10 can have higher temperature environments, air cooling can be insufficient to adequately cool down the computing systems 10. Accordingly, the cooling system 100 utilizes heat transfer fluid (e.g., PG25 and/or water) to pass through the liquid cooling system 50 and lower the temperature of the one or more computing components 30 of the computing system 10 to within a desired threshold.

As illustrated in FIGS. 2A and 2B, the liquid cooling system 50 can include a fluid distribution unit 11 which is operable to circulate the fluid through conduits 12, 14, 20 to distribute the fluid to one or more computing components 30 in the computing system 10, such as processors, servers, hard drives, etc. As shown in FIGS. 2A and 2B, the liquid cooling system 50 can include one or more return conduits 12 which carries hot fluid that received and removed heat from the one or more computing components 30. The return conduits 12 can provide the hot fluid to the fluid distribution unit 11 to be cooled down to a lower temperature. The cool fluid can then flow into the one or more outlet conduits 14 which carries the cool fluid to the one or more computing components 30.

The liquid cooling system 50 can include a secondary manifold 20 which includes the hottest return fluid from the computing component(s) 30, before the fluid enters the fluid distribution unit 11 or inside the fluid distribution unit 11. The secondary manifold 20 can include a first conduit 21 that flows the fluid to the second conduit 22 before entering the fluid distribution unit 11. The fluid cleaning apparatus 100 can be fluidly connected between the first conduit 21 and the second conduit 22 such that the fluid flows from the first conduit 21 into the fluid cleaning apparatus 100 and then into the second conduit 22. As such, the fluid cleaning apparatus 100 forms a part of the liquid cooling system 50 so that the fluid in the liquid cooling system 50 must pass through the fluid cleaning apparatus 100. Additionally, as the fluid cleaning apparatus 100 is attached to the secondary manifold 20, the fluid cleaning apparatus 100 cleans the fluid before the fluid enters the fluid distribution unit 11. Bacteria growth in the fluid distribution unit 11 is then reduced or prevented. In some examples, the fluid cleaning apparatus 100 can be attached to other portions of the liquid cooling system 50, for example after the fluid leaves the fluid distribution unit 11, without deviating from the scope of the disclosure.

In at least one example, as illustrated in FIG. 2B, the computing system 10 can include a plurality of fluid cleaning apparatuses 100 (e.g., the fluid cleaning apparatus 100 and one or more additional fluid cleaning apparatuses 100). The fluid cleaning apparatuses 100 can be fluidly coupled with the liquid cooling system 50 in parallel. Accordingly, the fluid cleaning apparatuses 100 are run in parallel for N+1 redundancy mode. The cleaning of the fluid with the fluid cleaning apparatus 100 can be scalable by including additional fluid cleaning apparatuses 100 as needed for the liquid cooling system 50. By adding additional fluid cleaning apparatuses 100, the rate of cleaning the fluid can be increased.

Figure 3:
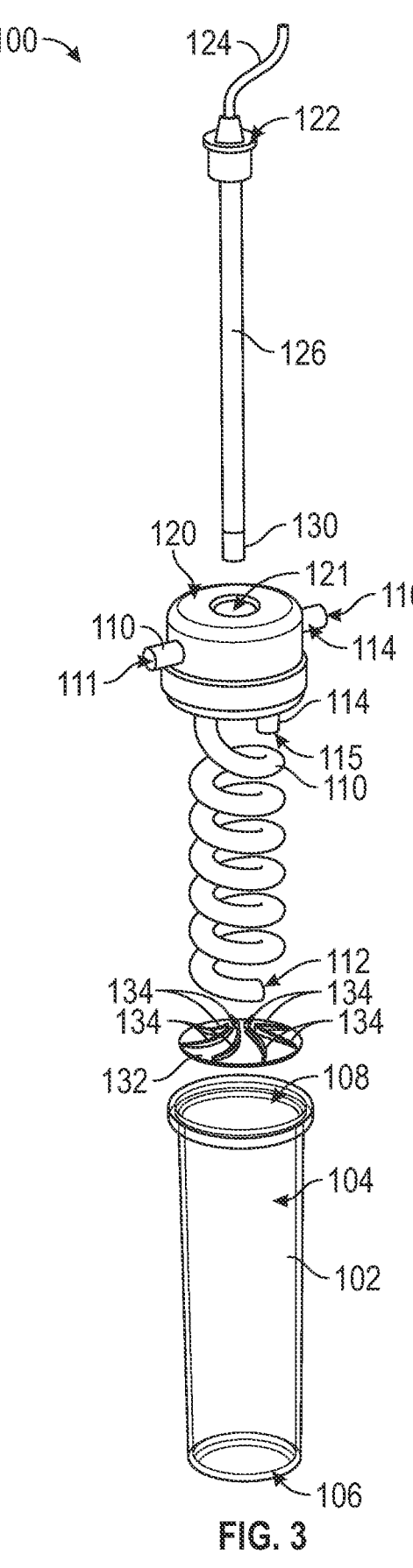
FIG. 3 illustrates an exploded view of the fluid cleaning apparatus.

Referring to FIGS. 1-3, the fluid cleaning apparatus 100 can include a body 102 forming a reservoir 104 that is in fluid communication with the liquid cooling system of the computing system 10. The reservoir 104 can be operable to receive fluid from the liquid cooling system 50. The body 102 can include a bottom end 106 and a top end 108 opposite the bottom end 106. In at least one example, the body 102 can have a substantially cylindrical shape. A cap 120 can be operable to close the top end 108 of the body 102 to prevent fluid from flowing out of the top end 108 of the body 102.

A supply component 110 can be operable to be in fluid communication with the liquid cooling system 50 and the reservoir 104. The supply component 110 can be operable to direct the fluid from the liquid cooling system 50 into the reservoir 104. In at least one example, the supply component 110 can be fluidly coupled with the liquid cooling system 50. For example, the supply component 110 can be fluidly coupled with the first conduit 21 of the liquid cooling system 50. The supply component 110 can form a supply entry port 111 operable to receive the fluid from the liquid cooling system 50. The fluid can then flow through the supply component 110 and exit the supply component 110 into the reservoir 104 via a supply exit port 112. In at least one example, as illustrated in FIGS. 1-3, the supply component 110 can be coupled with the cap 120. In some examples, the supply component 110 can be coupled with the body 102. In at least one example, as illustrated in FIGS. 1-3, the supply entry port 111 can be proximate the top end 108 of the body 102 (for example, in the cap 120). The supply exit port 112 can be proximate the bottom end 106 of the body 102. Accordingly, the supply component 110 can be operable to direct the fluid from the liquid cooling system 50 proximate the top end 108 of the body 102, through the body 102, and deposit the fluid proximate the bottom end 106 of the body 102.

A return component 114 can be in fluid communication with the reservoir 104 and the liquid cooling system 50 such that the fluid in the reservoir 104 flows back into the liquid cooling system 50. The return component 114 can form a return entry port 115 operable to be in fluid communication with the fluid in the reservoir 104. A return exit port 116 can be in fluid communication with the liquid cooling system 50, for example fluidly coupled with the second conduit 22. Accordingly, the fluid can flow from the reservoir 104 into the return entry port 115 and out the return exit port 116 into the liquid cooling system 50. In at least one example, the return entry port 115 can be proximate the top end 108 of the body 102. Accordingly, in such examples where the supply exit port 112 is proximate the bottom end 106 of the body while the return entry port 115 is proximate the top end 108 of the body 102, the fluid must flow through the body 102 from the bottom end 106 to the top 108 to exit the reservoir 104 and return to the liquid cooling system 50. In at least one example, the return component 114 can be coupled with the cap 120. In some examples, the return component 114 can be coupled with the body 102. Additionally, the return component 114 being proximate the top end 108 reduces the amount of bacteria that reaches the return component 114. Accordingly, the fluid that is returned to the liquid cooling system 50 has less bacteria.

A cleaning unit 122 can be operable to reduce the bacterial growth in the fluid received in the reservoir 104. In at least one example, the cleaning unit 122 can include a light emitter 126 operable to emit ultraviolet (UV) light to kill bacteria in the fluid. In at least one example, the UV light can have a wavelength between about 100 nanometers and about 400 nanometers. In some examples, the UV light can have a wavelength between about 200 nanometers and about 280 nanometers. When exposing bacteria in the fluid to the UV light emitting from the light emitter 126, the UV light penetrates through the bacteria cell wall and disrupts the structure of the bacteria's DNA molecules, prohibiting reproduction. Accordingly, the bacteria in the fluid received in the reservoir 104 of the fluid cleaning apparatus 100 is killed and/or prevented from reproducing to reduce or prevent biogrowth in the liquid cooling system 50. In at least one example, the light emitter 126 can include a substantially cylindrical rod. In at least one example, the light emitter 126 can span the reservoir 104 from the top end 108 towards the bottom end 106 of the body 102. Accordingly, the light emitter 126 emits UV light to substantially all of the fluid in the reservoir 104 to reduce or kill bacteria in the reservoir 104 before the fluid returns to the liquid cooling system 50. In at least one example, the light emitter 126 can be disposed in the reservoir 104. In some examples, the light emitter 126 can be disposed substantially in the centre of the reservoir 104 and/or the body 102. In some examples, the light emitter 126 can be disposed along the walls of the body 102. In some examples, the light emitter 126 can be disposed outside of the body 102 and the body 102 can be substantially transparent so that the UV light emitted from the light emitter 126 can enter the reservoir 104 to reduce the bacteria growth in the fluid.

In at least one example, the supply component 110 can have a spiral configuration towards the bottom end 106 of the body 102 such that the fluid flows into the reservoir 104 proximate the bottom end 106 of the body 102. In some examples, the supply component 110 can have a spiral configuration such that the light emitter 126 is received in the centre of the spiral configuration. The supply component 110 can be at least partially transparent such that the UV light emitted from the light emitter 126 can be received by the fluid flowing through the supply component 110. Accordingly, the UV light emitted from the light emitter 126 is killing the bacteria in the fluid as the fluid flows through the supply component 110 to be received in the reservoir 104. With such a spiral configuration, the fluid has increased exposure to the UV light to increase the number of bacteria in the fluid killed.

In at least one example, as illustrated in FIG. 3, the cleaning unit 122 can be coupled with the cap 120. For example, the light emitter 126 can be received through a cap aperture 121 formed in the cap 120 and received in the reservoir 104. In some examples, the cleaning unit 122 can include a cable 124 to provide power to the light emitter 126. In some examples, the cleaning unit 122 can be battery powered so that a cable 124 is not required. In some examples, the cable 124 can be in communication with a controller that permits a user to adjust the settings for the light emitter 126 (e.g., on, off, brighter, dimmer, etc.).

In at least one example, the cleaning unit 122 can include a stirrer 132 operable to agitate the fluid in the reservoir 104. The stirrer 132 can include one or more fins 134 operable to interact with the water when the stirrer 132 moves. In at least one example, the stirrer 132 can be powered by a motor 130. In at least one example, the motor 130 can be coupled to a bottom of the light emitter 126 which can be operable to move (e.g., rotate or translate) the stirrer 132. In at least one example, the stirrer 132 can be powered by the flow of the fluid. In at least one example, as illustrated in FIGS. 1-3, the stirrer 132 can be coupled with the light emitter 126. For example, the stirrer 132 can be coupled to the bottom of the light emitter 126. In at least one example, the stirrer 132 can be coupled with the cable 124 to receive power and extend through an inner chamber of the light emitter 126 and out of the bottom of the light emitter 126. The stirrer 132 can be disposed in the reservoir 104 proximate the bottom end 106 of the body 102. In some examples, the stirrer 132 can be disposed at any location in the reservoir 104. The stirrer 132 can then agitate the fluid as the fluid enters the reservoir 104 proximate the bottom end 106 via the supply component 110. The agitated fluid then flows through the reservoir 104 towards the top end 108 of the body 102 and exits the reservoir 104 proximate the top end 108 of the body 102 via the return component 114. Accordingly, the fluid must flow across substantially the entirety of the reservoir 104 and receive maximum exposure to the UV light from the light emitter 126 that spans the reservoir 104 from the top end 108 towards the bottom end 106.

The cleaning unit 122 including both the light emitter 126 and the stirrer 132 continuously kills the bacteria in the liquid cooling system 50. Additionally, the combination of the light emitter 126 and the stirrer 132 provides for a four-piece construction which is easy to assemble.

Figure 4:
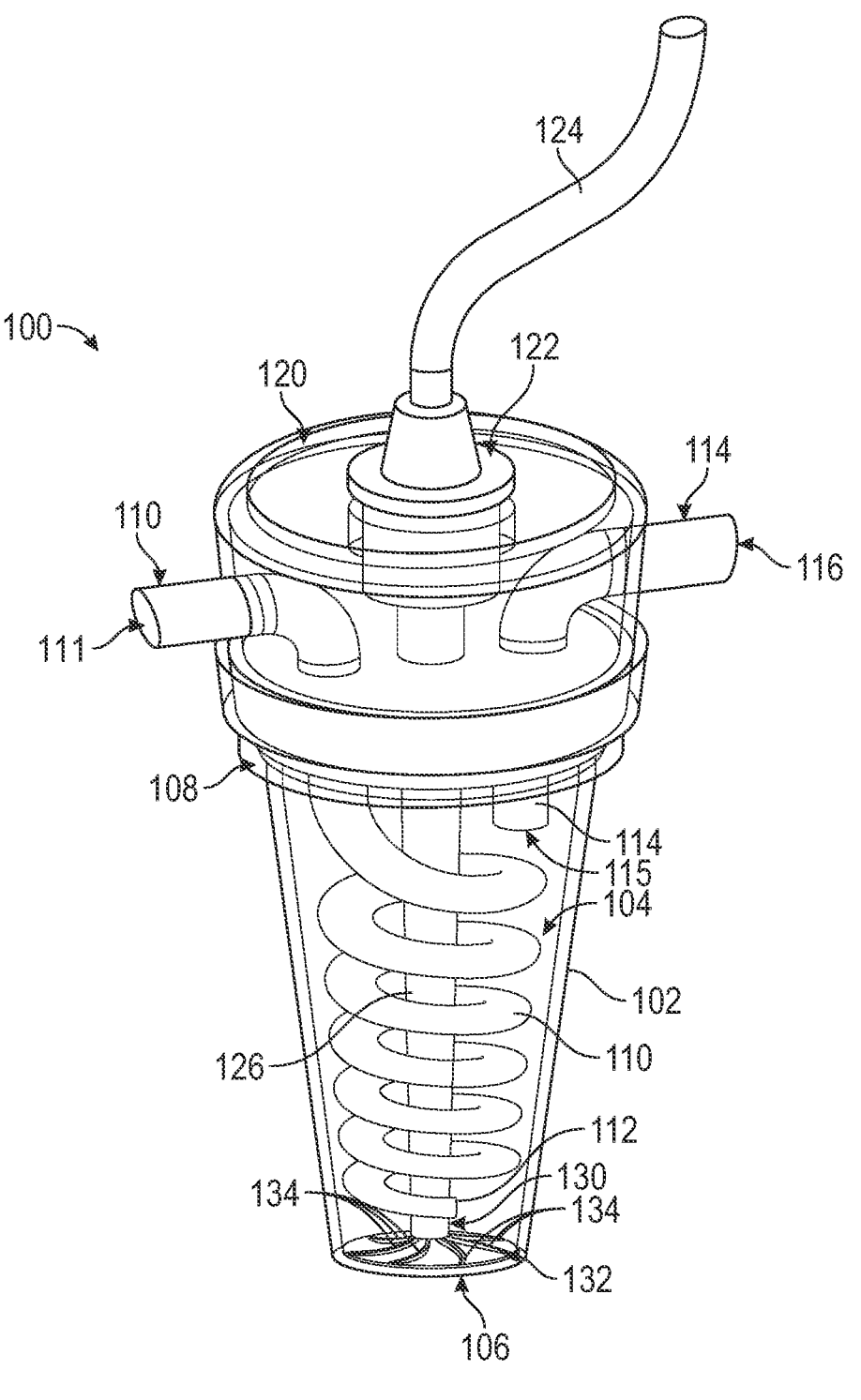
FIG. 4 illustrates a fluid cleaning apparatus with a body having a substantially conical shape.

In at least one example, as illustrated in FIG. 4, the body 102 can have a substantially conical shape such that the top end 108 of the body 102 has a top width that is greater than a bottom width of the bottom end 106 of the body 102. The substantially conical shape can achieve slower fluid velocity at the top end 108 compared to the bottom end 106. Accordingly, more bacteria is trapped inside the reservoir 104 due to gravity without entering the return component 114.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A fluid cleaning apparatus for a computing system, the fluid cleaning apparatus comprising:
   a body forming a reservoir;
   a cleaning unit at least partially disposed within the reservoir and operable to reduce bacterial growth in fluid received in the reservoir, the cleaning unit including a stirrer operable to move relative to the body effective to agitate the fluid in the reservoir;
   a supply component operable to be in fluid communication with the reservoir and a liquid cooling system of the computing system; and
   a return component in fluid communication with the reservoir and operable to be in fluid communication with the reservoir and the liquid cooling system.

2. The fluid cleaning apparatus of claim 1, wherein the stirrer is disposed in the reservoir proximate a bottom end of the body.

3. The fluid cleaning apparatus of claim 1, wherein the supply component has a spiral configuration that extends towards a bottom end of the body such that the fluid flows into the reservoir proximate the bottom end of the body.

4. The fluid cleaning apparatus of claim 1, wherein the body has a substantially cylindrical shape.

5. The fluid cleaning apparatus of claim 1, wherein the body has a substantially conical shape such that a top end of the body has a top width greater than a bottom width of a bottom end of the body.

6. The fluid cleaning apparatus of claim 1, wherein the return component includes a return entry port operable to be in fluid communication with the fluid in the reservoir.

7. The fluid cleaning apparatus of claim 6, wherein the return entry port is proximate a top end of the body.

8. The fluid cleaning apparatus of claim 1, wherein the cleaning unit further includes a light emitter operable to emit ultraviolet (UV) light.

9. The fluid cleaning apparatus of claim 8, wherein the UV light has a wavelength between about 100 nanometers and about 400 nanometers.

10. The fluid cleaning apparatus of claim 8, wherein the UV light has a wavelength between about 200 nanometers and about 280 nanometers.

11. The fluid cleaning apparatus of claim 8, wherein the light emitter is disposed in the reservoir.

12. The fluid cleaning apparatus of claim 11, wherein the light emitter includes a substantially cylindrical rod.

13. A computing system comprising:

a liquid cooling system operable to circulate a fluid to manage a temperature of one or more computing components; and a fluid cleaning apparatus fluidly coupled with the liquid cooling system, the fluid cleaning apparatus including:

a body forming a reservoir;

a cleaning unit at least partially disposed within the reservoir and operable to reduce bacterial growth in fluid received in the reservoir, the cleaning unit including a stirrer operable to move relative to the body effective to agitate the fluid in the reservoir;

a supply component operable to be in fluid communication with the reservoir and a liquid cooling system of the computing system; and a return component in fluid communication with the reservoir and operable to be in fluid communication with the reservoir and the liquid cooling system.

14. The computing system of claim 13, wherein the cleaning unit further includes a light emitter operable to emit ultraviolet (UV) light.

15. The computing system of claim 13, wherein the supply component has a spiral configuration that extends towards a bottom end of the body such that the fluid flows into the reservoir proximate the bottom end of the body.

16. The computing system of claim 13, wherein the fluid cleaning apparatus is fluidly coupled with a secondary manifold and/or a fluid distribution unit.

17. The computing system of claim 13, further comprising one or more additional fluid cleaning apparatuses, wherein the one or more additional fluid cleaning apparatuses and the fluid cleaning apparatus are fluidly coupled with the liquid cooling system in parallel.

18. A method of using a fluid cleaning apparatus, the method comprising:

supplying fluid through a supply component from a liquid cooling system of a computing system into a reservoir of a body;

returning the fluid through a return component from the reservoir of the body to the liquid cooling system of the computing system; and at least partially disposing a cleaning unit within the reservoir of the body to reduce bacterial growth in the fluid in the reservoir, wherein disposing in the cleaning unit within the reservoir of the body includes moving a stirrer relative to the body to agitate the fluid in the reservoir.

* * * * *